(12) United States Patent
Kim et al.

(10) Patent No.: US 8,510,624 B2
(45) Date of Patent: Aug. 13, 2013

(54) DATA PROCESSING SYSTEM WITH CONCATENATED ENCODING AND DECODING STRUCTURE

(75) Inventors: Jaehong Kim, Seoul (KR); Junjin Kong, Yongin-si (KR); Yong June Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 471 days.

(21) Appl. No.: 12/687,666

(22) Filed: Jan. 14, 2010

(65) Prior Publication Data

US 2010/0235711 A1  Sep. 16, 2010

(30) Foreign Application Priority Data

Mar. 10, 2009  (KR) .................. 10-2009-0020327

(51) Int. Cl.
| | |
|---|---|
| H03M 13/00 | (2006.01) |
| H03M 13/03 | (2006.01) |
| H04Q 1/20 | (2006.01) |
| H04L 27/00 | (2006.01) |

(52) U.S. Cl.
USPC ........... 714/755; 714/752; 714/758; 714/781; 714/786; 375/224; 375/295; 375/316; 370/216; 370/218; 370/242; 370/253

(58) Field of Classification Search
USPC ......... 714/755, 752, 758, 781, 786; 375/224, 375/295, 316; 370/216, 218, 242, 253
See application file for complete search history.

(56) References Cited

U.S. PATENT DOCUMENTS

| | | | | |
|---|---|---|---|---|
| 5,392,299 | A * | 2/1995 | Rhines et al. ................. | 714/756 |
| 5,396,504 | A * | 3/1995 | Pack .............................. | 714/755 |
| 5,400,347 | A * | 3/1995 | Lee ................................ | 714/756 |
| 5,708,665 | A * | 1/1998 | Luthi et al. .................... | 714/704 |
| 5,742,619 | A * | 4/1998 | Hassan .......................... | 714/755 |
| 5,745,497 | A * | 4/1998 | Ben-Efraim et al. ......... | 714/702 |
| 5,812,603 | A * | 9/1998 | Luthi et al. .................... | 375/287 |
| 5,875,199 | A * | 2/1999 | Luthi ............................. | 714/780 |
| 5,946,357 | A * | 8/1999 | Sandin et al. ................. | 375/296 |
| 5,966,412 | A * | 10/1999 | Ramaswamy ................ | 375/341 |
| 5,996,103 | A * | 11/1999 | Jahanghir ...................... | 714/755 |
| 6,029,264 | A * | 2/2000 | Kobayashi et al. ........... | 714/755 |
| 6,374,382 | B1 * | 4/2002 | Solomon et al. .............. | 714/755 |
| 6,658,605 | B1 * | 12/2003 | Yoshida et al. ............... | 714/702 |

(Continued)

FOREIGN PATENT DOCUMENTS

| | | |
|---|---|---|
| JP | 2002-237140 | 8/2002 |
| JP | 2007-299449 | 11/2007 |
| JP | 2008-005419 | 1/2008 |
| KR | 100766354 B1 | 10/2007 |

OTHER PUBLICATIONS

Ghanim Abd AlKareem, Three Dimensional Concatenated Codes in OFDM Transmission System under a Rayleigh Fading Channel with Carrier Interference, Jun. 2008, Journal of Engineering and Development, vol. 12, No. 2, pp. 137-156.*

*Primary Examiner* — John J Tabone, Jr.

(74) *Attorney, Agent, or Firm* — Myers Bigel Sibley & Sajovec, P.A.

(57) ABSTRACT

A data processing system includes a memory configured to receive data and an encoder configured to encode data being transferred to the memory. The encoder includes an outer encoder configured to generate an outer codeword by encoding the data being transferred to the memory, and an inner encoder configured to generate a plurality of inner codewords by encoding the outer codeword.

15 Claims, 11 Drawing Sheets

(56) References Cited

U.S. PATENT DOCUMENTS

| | | | |
|---|---|---|---|
| 6,795,507 B1* | 9/2004 | Xin et al. | 375/265 |
| 7,134,055 B2 | 11/2006 | Noda et al. | |
| 7,146,553 B2* | 12/2006 | Jarchi et al. | 714/755 |
| 7,774,689 B2* | 8/2010 | Chiu et al. | 714/786 |
| 2001/0025361 A1* | 9/2001 | Kim | 714/786 |
| 2003/0043487 A1* | 3/2003 | Morita et al. | 360/25 |
| 2006/0044162 A1* | 3/2006 | Fenn et al. | 341/50 |
| 2006/0107176 A1* | 5/2006 | Song | 714/758 |
| 2007/0266300 A1 | 11/2007 | Ito et al. | |
| 2007/0300126 A1 | 12/2007 | Nakao et al. | |
| 2008/0163026 A1* | 7/2008 | Varnica et al. | 714/755 |
| 2009/0027238 A1* | 1/2009 | Kong et al. | 341/50 |
| 2009/0241008 A1* | 9/2009 | Kim et al. | 714/755 |
| 2009/0249163 A1* | 10/2009 | Ovchinnikov et al. | 714/755 |
| 2009/0271688 A1* | 10/2009 | Jiang et al. | 714/784 |
| 2010/0067568 A1* | 3/2010 | Koslov et al. | 375/227 |
| 2010/0067614 A1* | 3/2010 | Koslov et al. | 375/295 |
| 2010/0246664 A1* | 9/2010 | Citta et al. | 375/240.01 |
| 2011/0022925 A1* | 1/2011 | Bhaskaran et al. | 714/752 |

* cited by examiner

US 8,510,624 B2

DATA PROCESSING SYSTEM WITH CONCATENATED ENCODING AND DECODING STRUCTURE

CROSS-REFERENCE TO RELATED APPLICATIONS

The present application claims priority under 35 U.S.C §119 to Korean Patent Application No. 10-2009-0020327 filed Mar. 10, 2009, the disclosure of which is incorporated herein by reference.

BACKGROUND

The present invention relates to data processing systems, and more particularly, the present invention relates to error control code structures for use in data processing systems.

When digital information is transferred, recorded or reproduced, in some instances errors can occur in portions of the digital information, due for example to the effects of alpha rays or other cosmic rays, to defects or noise in the transmission channel, and so on. There are known technologies that employ error detecting code or error correction code in order to detect such errors and correct any detected errors. In principle, there is no difference between error detecting codes and error correction codes, and they may be referred to collectively as error control codes. Similarly, the use of error detection and error correction may be referred to collectively as error control.

In transferring or recording digital information using error control codes, for example, m-bit error control information (redundant bits) is appended to k-bit digital information (information bits) to generate a (k+m)-bit codeword. The (k+m) bit codeword is then transmitted across a communication channel. At the transfer destination of the codeword (i.e. the receiver), error detection or error correction is performed using the redundant bits contained in the codeword. The process of generating the codeword is termed "encoding", while the process of error detection and/or error correction based on the codeword is termed "decoding."

With a view to further improving reliability during transmission or recording of digital information, it may be desirable to employ error control codes having high error correction/error detection capability. However, when codes with high error correction/error detection capability are used, the bit length of the redundant bits tends to be longer, and the efficiency of information transmission tends to decline.

SUMMARY

A data processing system according to some embodiments includes a channel configured to receive data and an encoder configured to encode data being transferred to the channel. The encoder includes an outer encoder configured to generate an outer codeword by encoding the data being transferred to the channel and an inner encoder configured to generate a plurality of inner codewords by encoding the outer codeword.

A data processing system according to further embodiments includes a channel configured to receive data and an error control unit configured to encode data being transferred to the channel and to decode data received from the channel. The error control unit is configured to generate a plurality of inner codewords, to be transferred to the channel, based on one message and to generate one message based on a plurality of inner codewords received from the memory channel.

A data processing system according to still further embodiments includes a channel configured to receive data and an encoder configured to encode data being transferred to the channel. In some embodiments, the encoder includes an outer encoder configured to generate a plurality of outer codewords by encoding the data being transferred to the channel and an inner encoder configured to generate a plurality of inner codewords by encoding the plurality of outer codewords. The number of the plurality of outer codewords may be less than the number of the plurality of inner codewords. In other embodiments, the encoder includes an outer encoder configured to generate a plurality of outer codewords by encoding the data being transferred to the channel and an inner encoder configured to generate an inner codeword by encoding the plurality of outer codewords.

BRIEF DESCRIPTION OF THE DRAWINGS

The above and other features will become apparent from the following description with reference to the following figures, wherein like reference numerals refer to like parts throughout the various figures unless otherwise specified, and wherein.

DETAILED DESCRIPTION OF THE EMBODIMENTS

Figure 1:
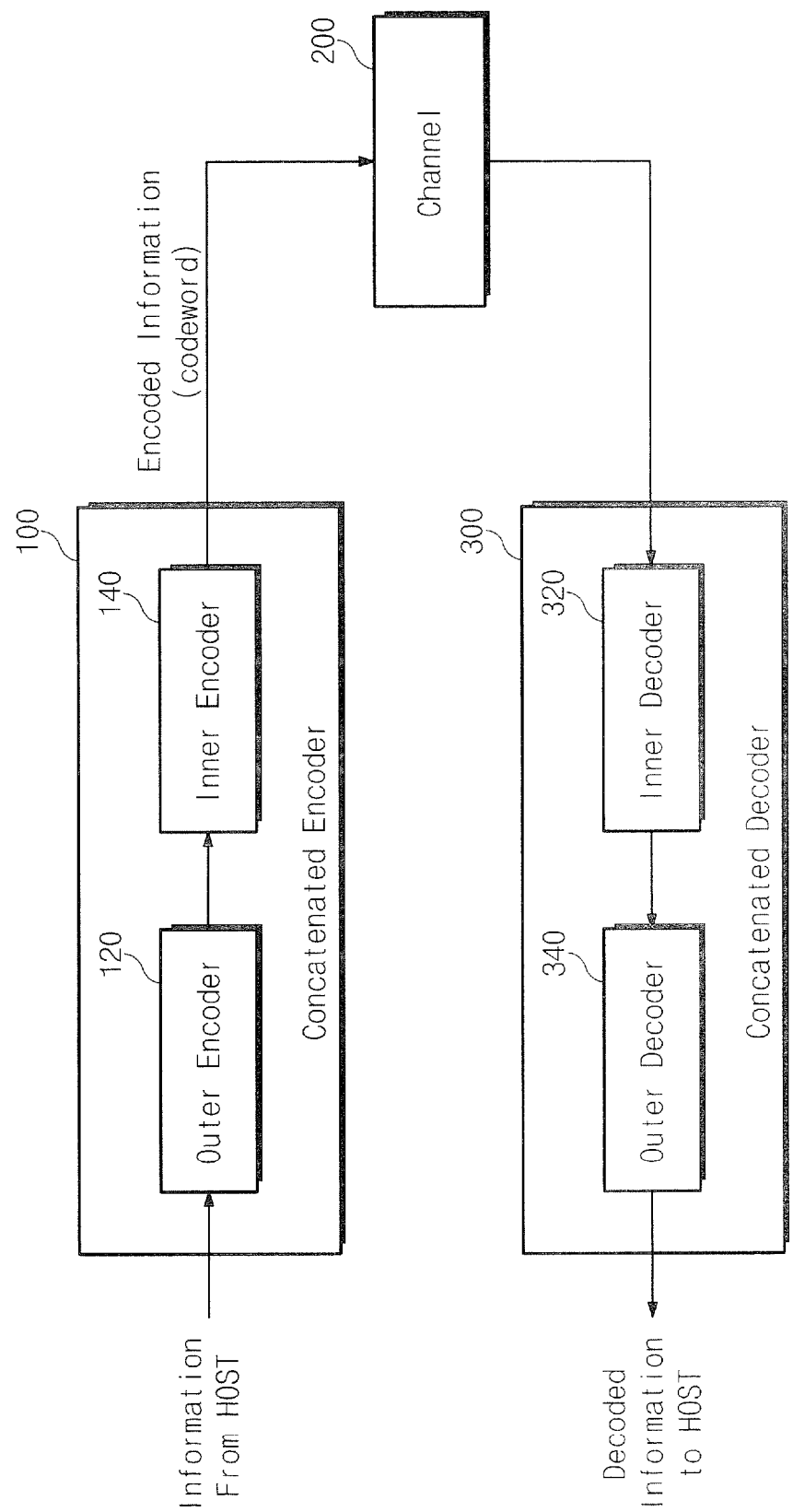
FIG. 1 is a block diagram showing a data processing system according to some embodiments.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

An error control code structure according to some embodiments will be described in the context of a data processing system, such as a data storage system or a memory system. However, an error control code structure according to some embodiments is not limited to use in a data processing system. For example, an error control code structure according to some embodiments can be applied to systems including various channels such as a wireless channel, a wireline channel, a memory channel, a storage channel, an optical channel, and the like. Error control code structures according to various embodiments will be more fully described with reference to the accompanying drawings.

FIG. 1 is a block diagram showing a data processing system according to some embodiments.

Referring to FIG. 1, a data processing system may be configured to encode information (i.e., a data or message) using a concatenated code structure. Codes of the concatenated code structure may include error correction codes which are obtained by concatenating an inner code and an outer code. In other words, concatenated codes may be formed of two or more different codes. For ease of description, an error control code structure according to some embodiments will be more fully in the context of concatenated codes that are formed of two different codes, that is, an inner code and an outer code.

A concatenated encoder 100 may be configured to receive information from a host and to encode the input information according to a concatenated code structure. The concatenated encoder 100 may include an outer encoder 120 and an inner encoder 140. The outer encoder 120 may encode the input information according to a first coding technique to generate an outer codeword. The inner encoder 140 may encode an output (that is, an outer codeword) of the outer encoder 120 according to a second coding technique to generate an inner codeword. The inner codeword encoded by the inner encoder 140 may be transferred to a channel 200.

Error control codes may generally be classified as block codes or tree codes. Block codes may include, for example, a BCH (Bose, Chaudhuri, Hocque-nghem) code, an RS (Reed-Solomon) code, an LDPC (Low-Density Parity-Check) code, and the like. Tree codes may include, for example, a convolutional code, a turbo code, and the like. Each of the first and second coding techniques may employ a block code or a tree code. The first coding technique may differ from the second coding technique.

Encoded information (for example, an inner codeword) issuing from the concatenated encoder 100 may be transported through the channel 200 to a concatenated decoder 300. In some embodiments, the channel 200 may include a wireless channel, a wireline channel, a memory channel, a storage channel, an optical channel, and the like.

The concatenated decoder 300 may include an inner decoder 320 and an outer decoder 340. The concatenated decoder 300 may be configured to receive data (that is, encoded data) transferred through the channel 200 and to decode the received data. The inner decoder 320 may be configured to decode input information (that is, encoded data) according to the coding technique that is used by the inner encoder 140. The outer decoder 340 may be configured to decode an output of the inner decoder 320 according to the coding technique that is used by the outer encoder 120 and to send the decoded information to the host.

The concatenated code structure with outer and inner codes may be employed to improve the bit error rate (BER) performance of an error control code (ECC) and to make up for the weakness of a single code.

Figure 2:
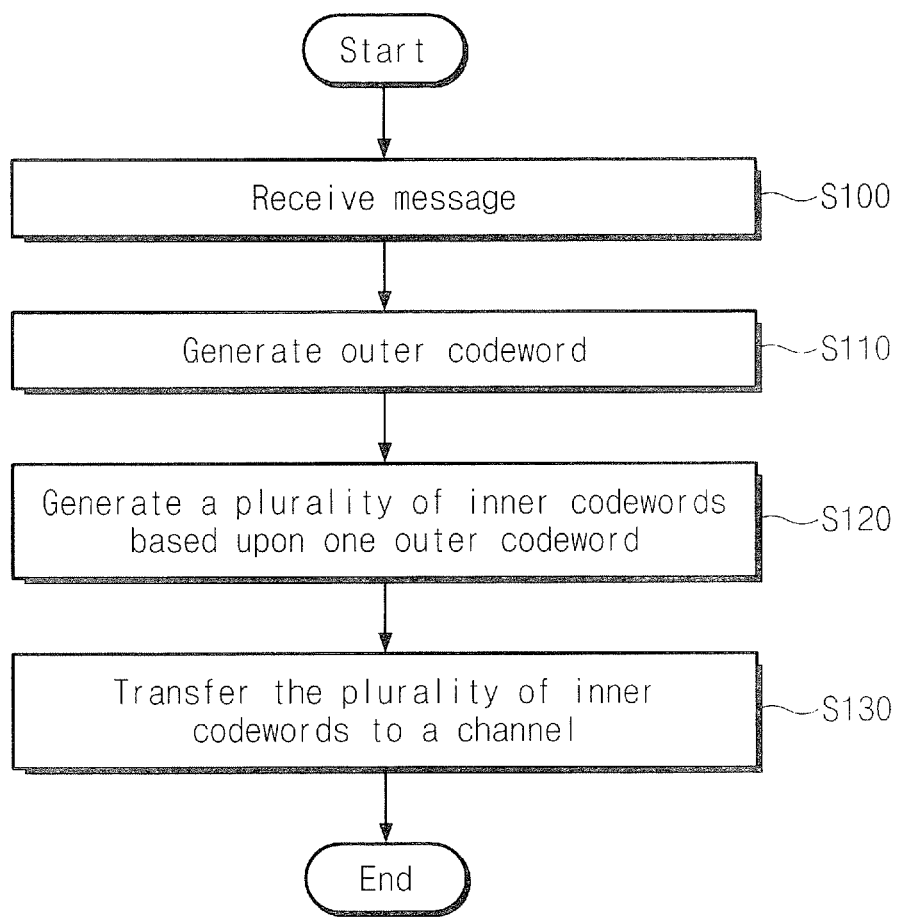
FIG. 2 is a flowchart illustrating encoding operations of a concatenated encoder according to some embodiments.
Figure 3:
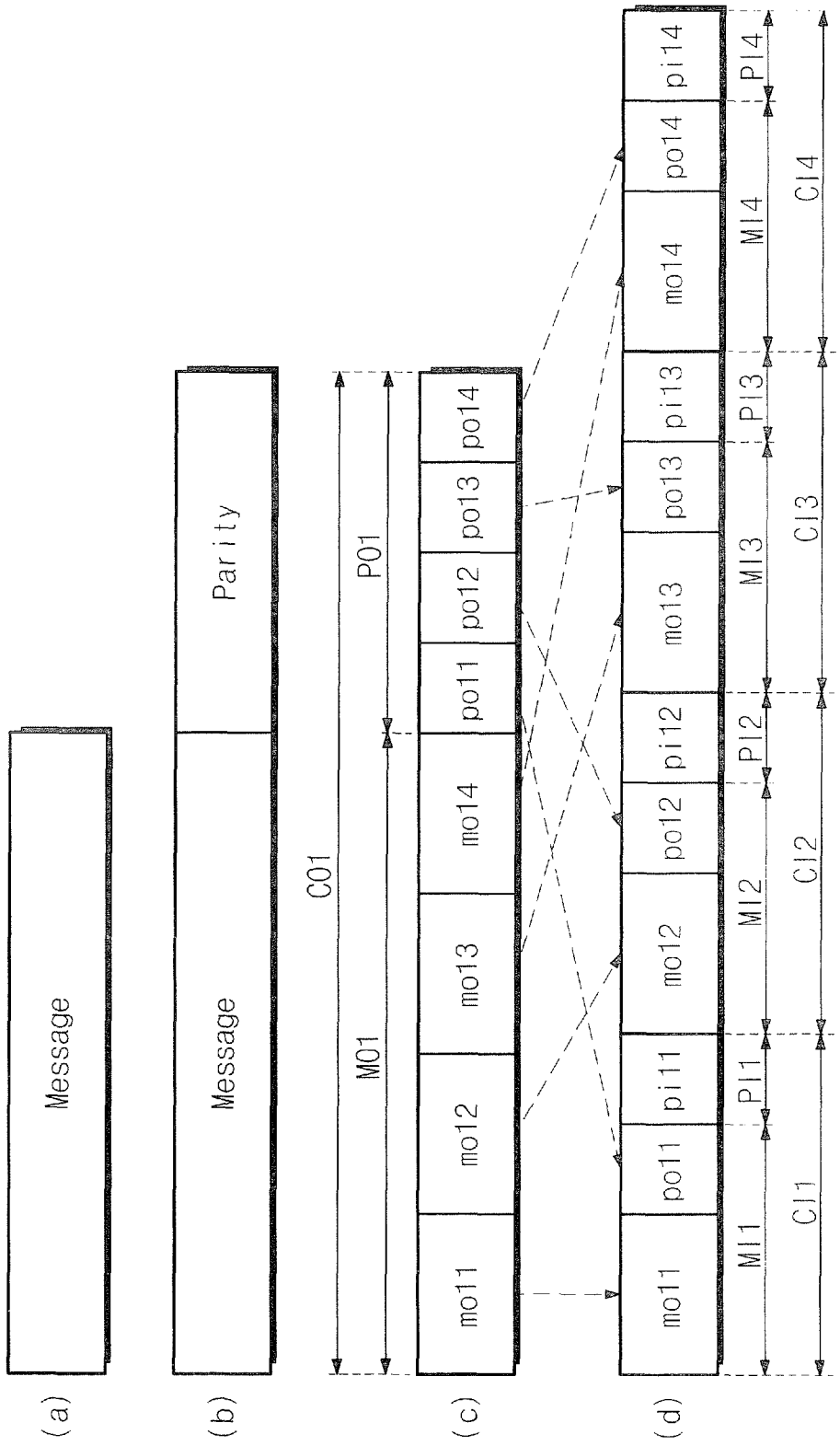
FIG. 3 illustrates error control code structures according to an operation of a concatenated encoder.

FIG. 2 is a flowchart illustrating encoding operations of a concatenated encoder according to some embodiments, and FIG. 3 illustrates error control code structures according to an operation of a concatenated encoder. Operation of a concatenated encoder according to some embodiments will be more fully described below with reference to the accompanying drawings.

In step S100, a concatenated encoder 100 may receive information (for example, message data) from an external device, such as a host. The input information, that is, message data, may be provided to an outer encoder 120. In step S120, the outer encoder 120 may generate error control code parity data (hereinafter, referred to as ECC parity data) based on the input information, that is, message data. The outer encoder 120 may produce the ECC parity data based on a coding technique which uses any one of block codes, such as the BCH code, the RS code, the LDPC code, and the like, and tree codes, such as the convolutional code, the turbo code, and the like. As a result, the outer encoder 120 may output a first codeword CO1 as illustrated in FIG. 3(b). The first codeword CO1 means a message MO1 to which ECC parity data PO1 is appended.

In step S120, an inner encoder 140 may generate a second plurality of codewords based on the first codeword CO1 being an outer codeword. As illustrated in FIG. 3(c), the inner encoder 140 may divide a message MO1 and an ECC parity PO1 of the first codeword CO1 into N portions, respectively. For example, as shown in FIG. 3(c), the inner encoder 140 may divide the message M01 of the outer codeword CO1 into four divided message portions mol1 to mol4 and may divide the ECC parity PO1 into four divided ECC parity portions pol1 to pol4.

Referring to FIG. 3(d), the inner encoder 140 may generate the second codewords CI1 to CI4 using the divided message portions and the divided ECC parity portions. For example, the inner encoder 140 may generate an ECC parity pil1 of the second codeword CI1 using the divided message portion mol1 and the divided ECC parity portion pol1. Herein, the divided message portion mol1, the divided parity portion pol1, and the ECC parity pil1 may constitute the second codeword CI1. That is, the inner encoder 140 may produce the second codeword CI1 using the divided message portion mol1 and the divided ECC parity portion pol1. The remaining codewords CI2, CI3, and CI4 may be constructed in a similar manner as described above.

As described above, the inner encoder 140 may be configured to generate a plurality of, for example, four, inner codewords CI1~CI4 using one outer codeword CO1. It is well understood that a division rate of the outer codeword CO1 is not limited to four. For example, it is possible to divide a message MO1 and an ECC parity PO1 of the first codeword CO1 into three or less portions or into five or more portions, respectively.

Afterwards, in step S130, the second codewords CI1~CI4 may be sent to a channel 200. The channel 200 may be a channel formed to store data from the concatenated encoder 100 permanently or temporarily, for example.

In some embodiments, the inner encoder 140 may produce ECC parity data based on a coding technique which uses a block code, such as the BCH code, the RS code, the LDPC code, and the like, and/or tree codes, such as the convolutional code, the turbo code, and the like. Furthermore, the inner encoder 140 may produce ECC parity data using a different coding technique from the outer encoder 120.

Figure 4:
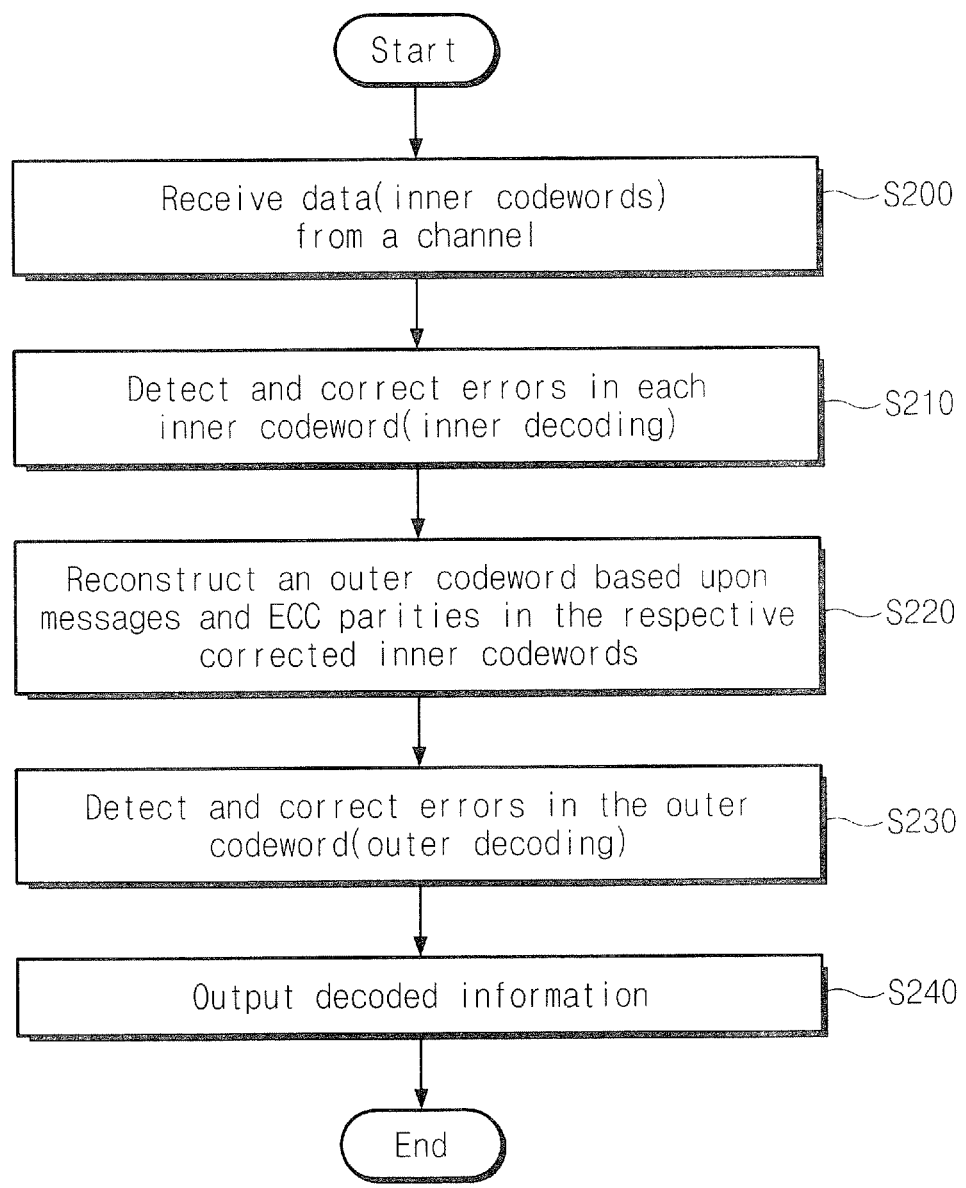
FIG. 4 is a flowchart illustrating decoding operations of a concatenated decoder according to some embodiments.
Figure 5:
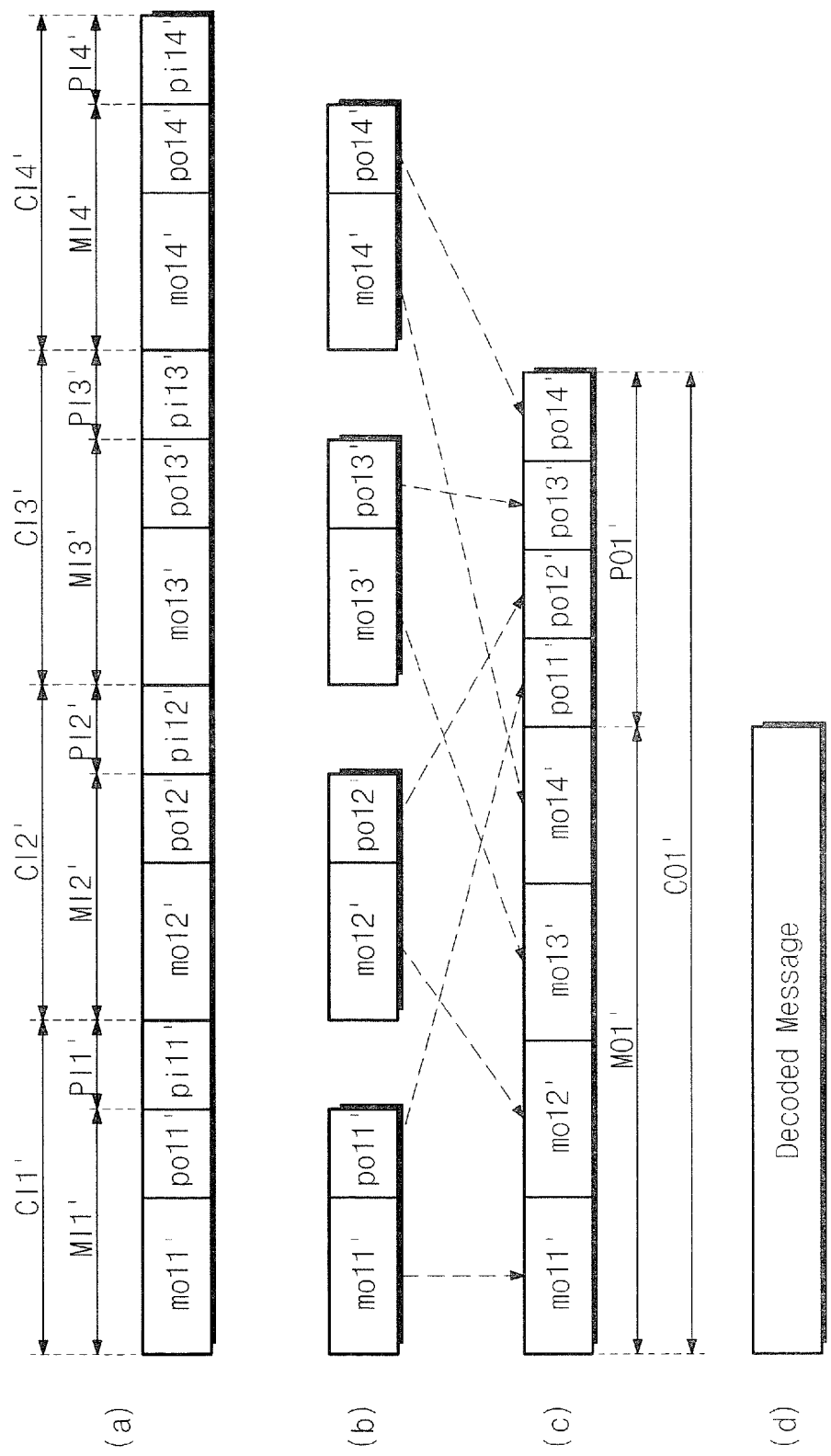
FIG. 5 illustrates error control code structures according to an operation of a concatenated decoder.

FIG. 4 is a flowchart that illustrates decoding operations of a concatenated decoder according to some embodiments, and FIG. 5 illustrates error control code structures according to an operation of a concatenated decoder. Operations of a concatenated decoder according to some embodiments will be more fully described with reference to the accompanying drawings.

In step S200, data including inner codewords CI1'~CI4' may be provided to an inner decoder 320 from a channel 200. One or more of the inner codewords may include an error due to noise or other disturbance introduced in the channel 200. In step S210, the inner decoder 320 may decode the input data. For example, the inner decoder 320 may detect and correct errors of message portions in the inner codewords CI1'~CI4' based on ECC parity data of the inner codewords CI1'~CI4'. This operation may be referred to as an inner decoding operation. For example, the inner decoder 320 may detect and correct errors of a message portion MI1' in the inner codeword CI1' based on ECC parity data PI1' of the inner codeword CI1'. As the decoding result, the inner decoder 320 may output error-corrected data (mol1', pol1') as illustrated in FIG. 5(b). Errors of message portions in remaining inner codewords CI2'~CI4' may be detected and corrected in a similar manner as the inner codeword CI1.

In step S220, the inner decoder 320 may reconstruct an estimated outer codeword CO1' based on message portions and ECC parity portions in the decoded inner codewords. Specifically, the inner decoder 320 may collect decoded message portions mol1', mol2', mol3', and mol4' to construct a message MO1' of an estimated outer codeword CO1'. Further, the inner decoder 320 may collect ECC parity portions pol1', pol2', pol3', and pol4' to construct an ECC parity PO1' of the estimated outer codeword CO1'. The inner decoder 320 may output the estimated outer codeword CO1' as an input of an outer decoder 340.

In step S230, the outer decoder 340 may decode the estimated outer codeword CO1' to output decoded information. For example, the outer decoder 340 may detect and correct errors of a message MO1' in the estimated outer codeword CO1' based on the ECC parity data PO1' of the estimated outer codeword CO1'. This operation may be referred to as an outer decoding operation. Afterwards, in step S240, the outer decoder 340 may send the message MO1' of the estimated outer codeword CO1' to an external device (for example, a host) as decoded information.

In some embodiments, instead of the inner decoder 320, the outer decoder 340 may be configured to construct a message MO1' of an estimated outer codeword CO1' by collecting decoded message portions mol1', mol2', mol3', and mol4' and to construct an ECC parity PO1' of the estimated outer codeword CO1' by collecting ECC parity portions pol1', pol2', pol3', and pol4'.

In further embodiments, there can be provided a data shuffler between the inner decoder 320 and the outer decoder 340 which is configured to construct a message MO1' of an estimated outer codeword CO1' by collecting decoded message portions mol1', mol2', mol3', and mol4' and to construct an ECC parity PO1' of the estimated outer codeword CO1' by collecting ECC parity portions pol1', pol2', pol3', and pol4'.

Figure 6:
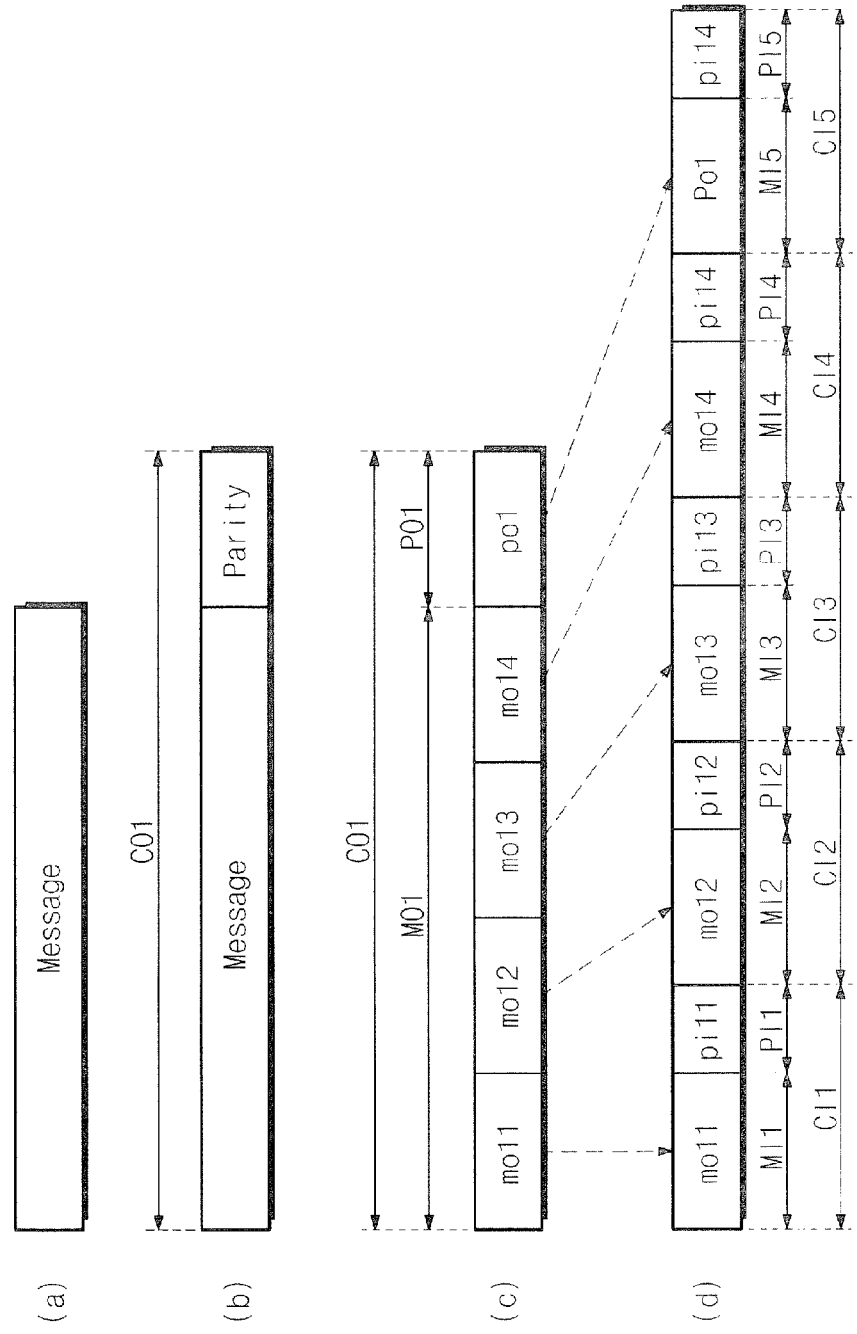
FIGS. 6 to 8 are diagrams that illustrate encoding operations of a concatenated encoder according to further embodiments.

FIG. 6 is a diagram illustrating encoding operations of a concatenated encoder according to further embodiments. Below, encoding operations of a concatenated encoder according to further embodiments will be more fully described with reference to the accompanying drawings.

As illustrated in FIG. 6(a), a concatenated encoder 100 may receive information (message data) from an external device (for example, a host). The input information, that is, message data, may be provided to an outer encoder 120. The outer encoder 120 may produce ECC parity data based on the message data. The outer encoder 120 may generate the ECC parity data according to a coding technique which uses block codes, such as the BCH code, the RS code, the LDPC code, and the like and/or tree codes, such as the convolutional code, the turbo code, and the like. Accordingly, the outer encoder 120 may output the first codeword CO1 as illustrated in FIG. 6(b). The first codeword CO1 may be formed of message data MO1 and ECC data PO1.

Then, an inner encoder 140 may produce a plurality of second codewords based on the first codeword CO1 being an outer codeword. Specifically, as illustrated in FIG. 6(c), the inner encoder 140 may divide a message MO1 of the first codeword CO1 into N (for example, 4) message portions mol1 to mol4. As illustrated in FIG. 6(d), the inner encoder 140 may generate the second codewords CI1~CI5 based on the partitioned message data portions mol1 to mol4 and the ECC parity data p01. For example, the inner encoder 140 may generate ECC parity data pil1 using the divided message data portion mol1 to generate the second codeword CI1 formed of the divided message data portion mo1 and the ECC parity data pi1. The remaining codewords CI2~CI4 may be generated in a similar manner as the codeword CI1. Similarly, the inner encoder 140 may generate the codeword CI5 using the parity information PO1 of the first codeword CO1, that is, ECC parity data po1. Codewords CI1~CI5 thus generated may be sent sequentially to a channel 200.

In some embodiments, the inner encoder 140 may generate the ECC parity data according to a coding technique which uses block codes, such as BCH codes, RS codes, LDPC codes, and the like and/or tree codes, such as convolutional codes, turbo codes, and the like. In some embodiments, the inner encoder 140 may generate the ECC parity data using a different code from the outer encoder 120.

The second codewords CI1~CI5 generated by encoding a message in the above-described manner may be decoded in a similar manner as described with reference to FIGS. 4 and 5.

In some embodiments, the message MO1 in the first codeword CO1 may be partitioned in different ways. For example, the message MO1 of the first codeword CO1 may be partitioned into four or less message portions or into four or more message portions.

Figure 7:
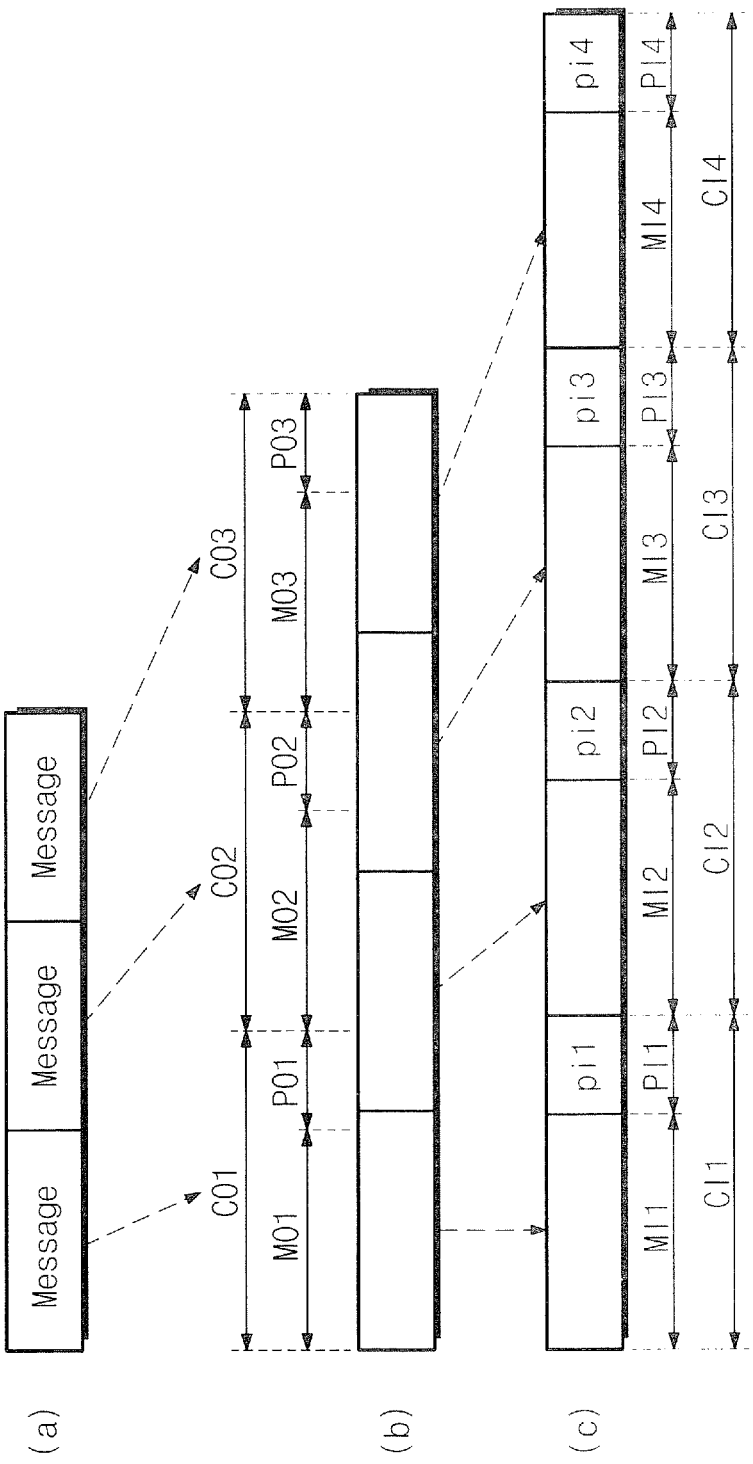

FIG. 7 is a diagram illustrating encoding operations of a concatenated encoder according to further embodiments. An encoding operation of a concatenated encoder according to further embodiments will be more fully described with reference to the accompanying drawings.

As illustrated in FIG. 7(a), a concatenated encoder 100 may receive information (message data) from an external device (for example, a host). The input information, that is, message data, may be provided to an outer encoder 120. The outer encoder 120 may produce ECC parity data based on the message data. The outer encoder 120 may generate the ECC parity data according to a coding technique which uses block codes, such as the BCH code, the RS code, the LDPC code, and the like and/or tree codes, such as the convolutional code, the turbo code, and the like. Accordingly, the outer encoder 120 may output the first codewords CO1~CO3 each corresponding to input messages as illustrated in FIG. 7(b).

An inner encoder 140 may generate N inner codewords based on M outer codewords (N being an integer greater than M). In the embodiments illustrated in FIG. 7, the inner encoder 140 may be configured to generate four inner codewords CI1, CI2, CI3, and CI4 based on three outer codewords CO1, CO2, and CO3. As illustrated in FIG. 7(c), a message portion in each inner codeword may include all or a part of a message of an outer codeword and all of a part of ECC parity data thereof.

The second codewords CI1~CI4 generated by encoding messages in the above-described manner may be decoded in a similar manner as described with reference to FIGS. 4 and 5.

Figure 8:
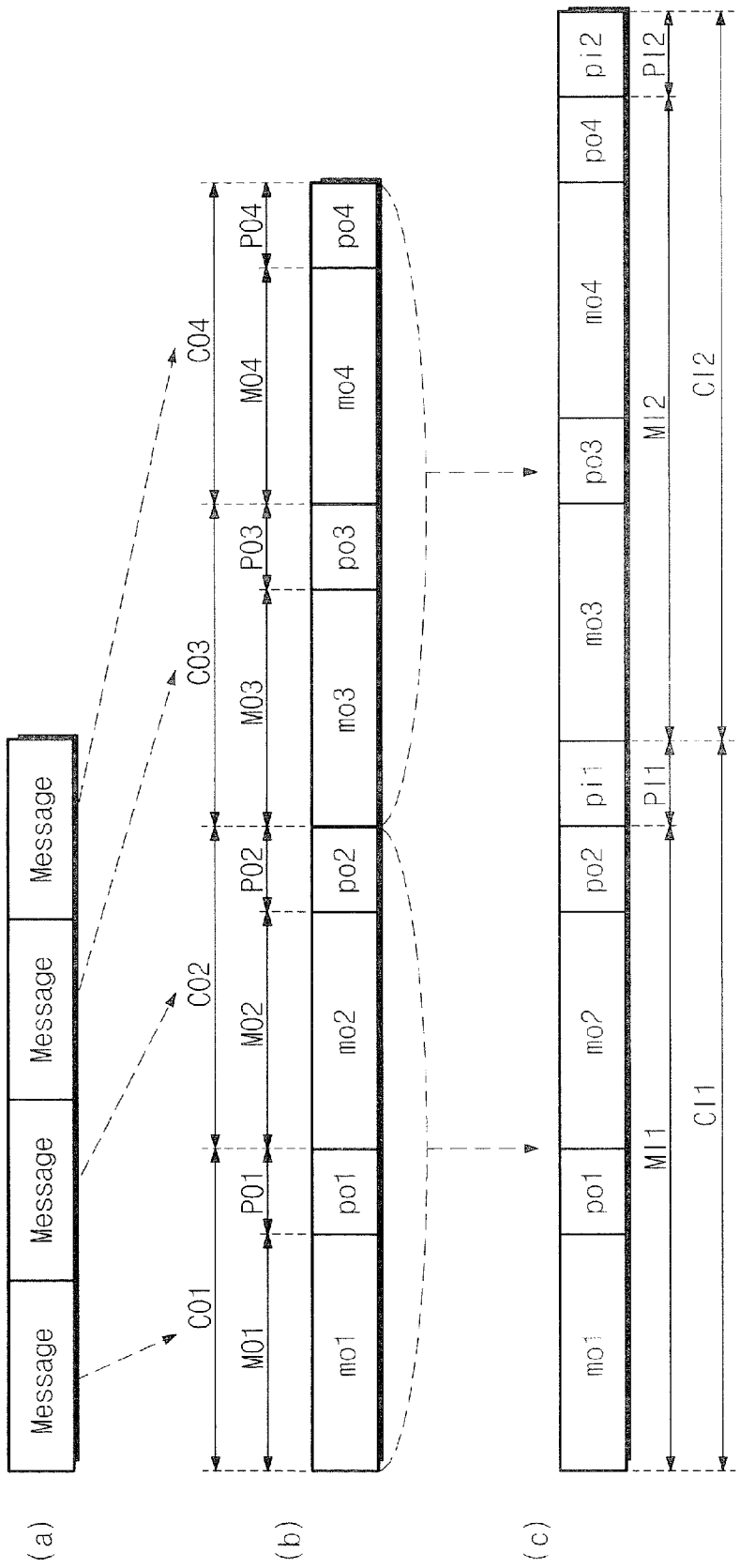

FIG. 8 is a diagram that illustrates encoding operations of a concatenated encoder according to other embodiments. An encoding operation of a concatenated encoder according to other embodiments will be more fully described with reference to the accompanying drawings.

As illustrated in FIG. 8(a), a concatenated encoder 100 may receive information (message data) from an external device (for example, a host). The input information, that is, message data, may be provided to an outer encoder 120. The outer encoder 120 may produce ECC parity data PO1~PO4 based on the message data. The outer encoder 120 may generate the ECC parity data according to a coding technique which uses block codes, such as the BCH code, the RS code, the LDPC code, and the like and/or tree codes, such as the convolutional code, the turbo code, and the like. Accordingly, the outer encoder 120 may output the first codewords CO1~CO4 each corresponding to input messages as illustrated in FIG. 8(b).

Subsequently, an inner encoder 140 may generate one inner codeword based on a plurality of outer codewords. For example, the inner encoder 140 may generate ECC parity data PI1 based on two outer codewords CO1 and CO2. Accordingly, as illustrated in FIG. 8(c), the inner encoder 140 may receive two outer codewords CO1 and CO2 to generate one inner codeword CI1 formed of a message MI1 and ECC parity PI1. Similarly, the inner encoder 140 may generate ECC parity data PI2 based on two outer codewords CO3 and CO4. Accordingly, the inner encoder 140 may receive two outer codewords CO3 and CO4 to generate one inner codeword CI2 formed of a message MI2 and ECC parity PI2.

The second codewords CI1 and CI2 generated by encoding messages in the above-described manner may be decoded in a similar manner as described in FIGS. 4 and 5.

Figure 9:
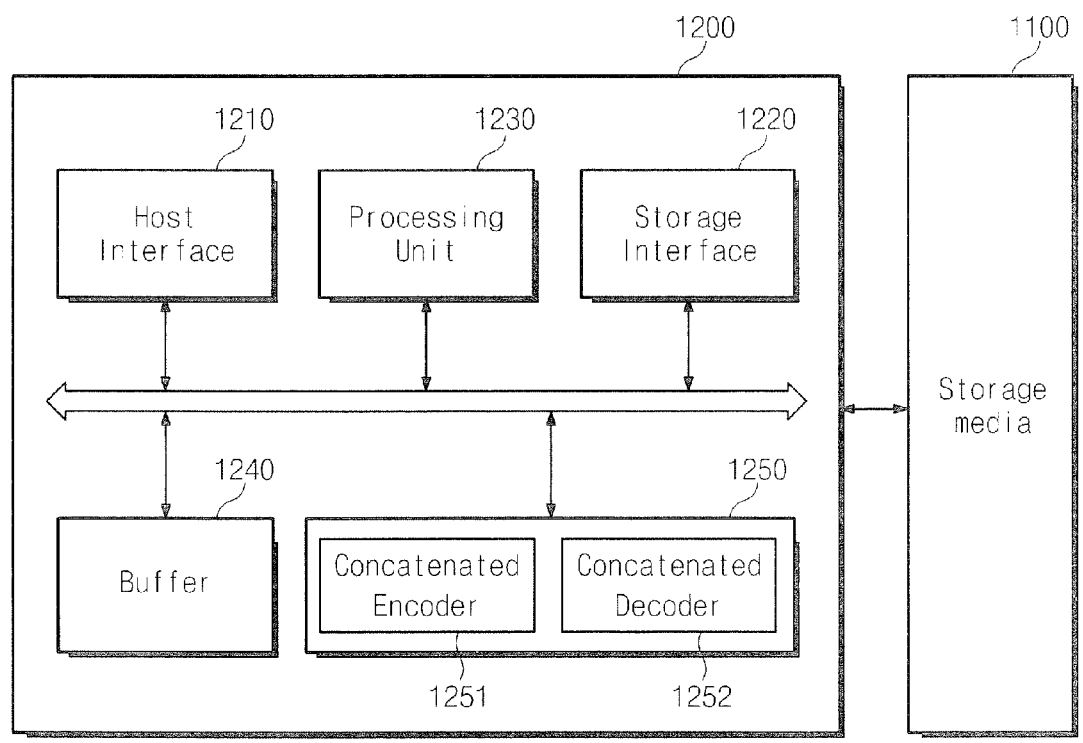
FIG. 9 is a block diagram showing a data processing system according to some embodiments.
Figure 10:
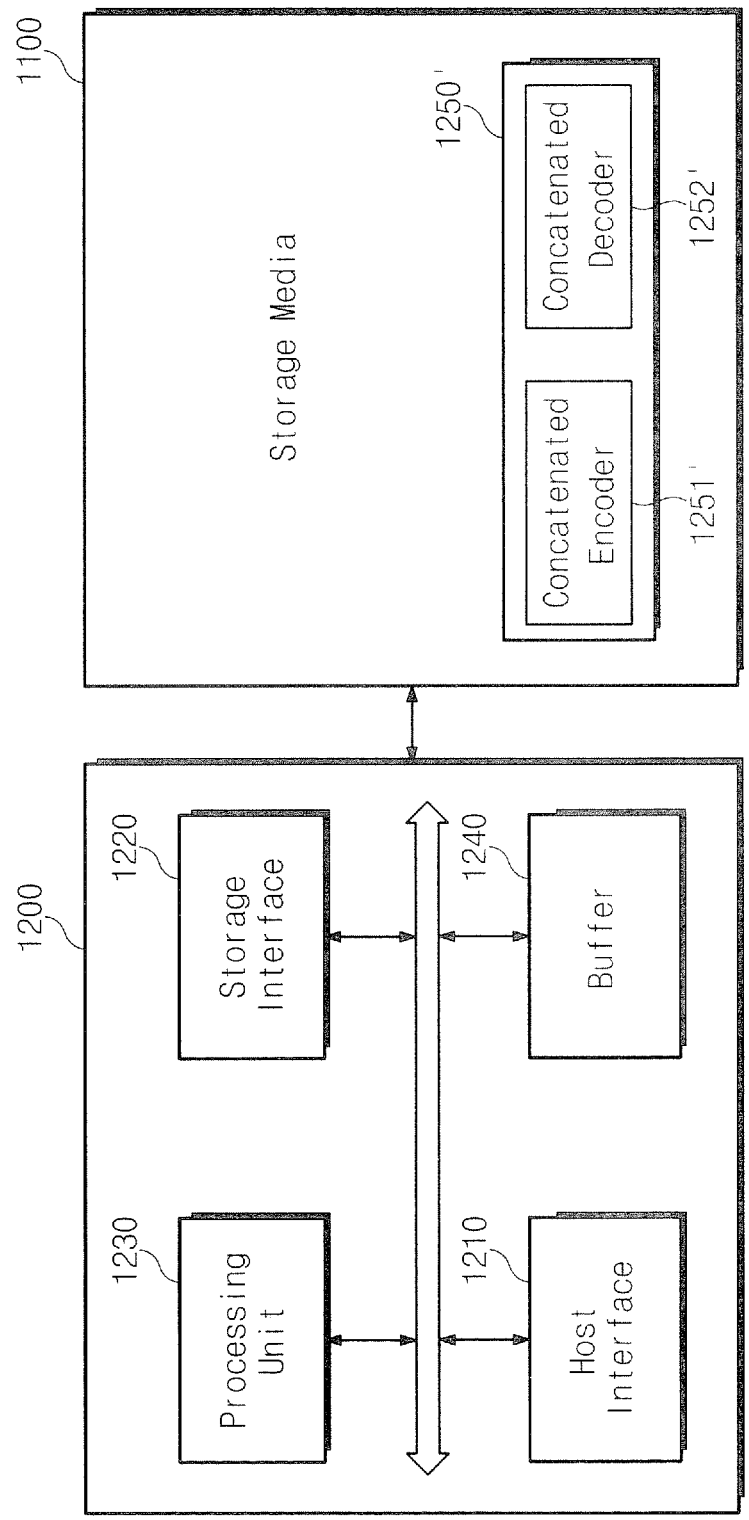
FIG. 10 is a block diagram showing a data processing system according to further embodiments.

FIG. 9 is a block diagram showing a data processing system according to some embodiments, and FIG. 10 is a block diagram showing a data processing system according to further embodiments. A data processing system in FIG. 9 may be an example of a system in which there is used a memory channel as a channel in FIG. 1, that is, a storage media.

Referring to FIG. 9, the data processing system may include a storage media 1100 and a controller 1200. The storage media 1100 may be embodied by semiconductor memories, such as a flash memory, DRAM, PRAM, FRAM, MRAM, RRAM, and the like, a compact disk, a magnetic storage device, an optical storage device, or the like. But, it will be understood that the storage media 1100 is not so limited. In the event that the storage media 1100 is embodied by SSD or a non-volatile memory, each storage element in the storage media 1100 may be configured to store 1-bit data or multi-bit data. Further, the storage media 1100 may be realized to have a conventional, for example, two-dimensional, array structure or a three-dimensional array structure.

The controller 1200 may be configured to store data in the storage media 1100 and read data from the storage media 1100. The controller 1200 may include a host interface 1210, a storage interface 1220, a processing unit 1230, a buffer memory 1240, and an error control unit 1250. The host interface 1210 may be configured to interface with an external device (for example, a host), and the storage interface 1220 may be configured to interface with the storage media 1100. The processing unit 1230 may be configured to control an overall operation of the controller 1200. The buffer memory 1240 may be used to temporarily store data to be written in the storage media 1100 or data read out from the storage media 1100. Further, the buffer memory 1240 may be used as a work memory of the processing unit 1230. The error control unit 1250 may be configured to encode data to be stored in the storage media 1100 and to decode data read out from the storage media 1100. The error control unit 1250 may include a concatenated encoder 1251 and a concatenated decoder 1252. The concatenated encoder 1251 and the concatenated decoder 1252 may be configured to perform encoding and decoding operations which are described in FIGS. 1 to 8, and description thereof is thus omitted.

In some embodiments, the controller 1200 and the storage media 1100 may form a memory card or a solid state drive (SSD). In some embodiments, as illustrated in FIG. 10, instead of the controller 1200, the storage media 1100 may be configured to include an error control unit 1250' including a concatenated encoder 1251' and a concatenated decoder 1252'.

Figure 11:
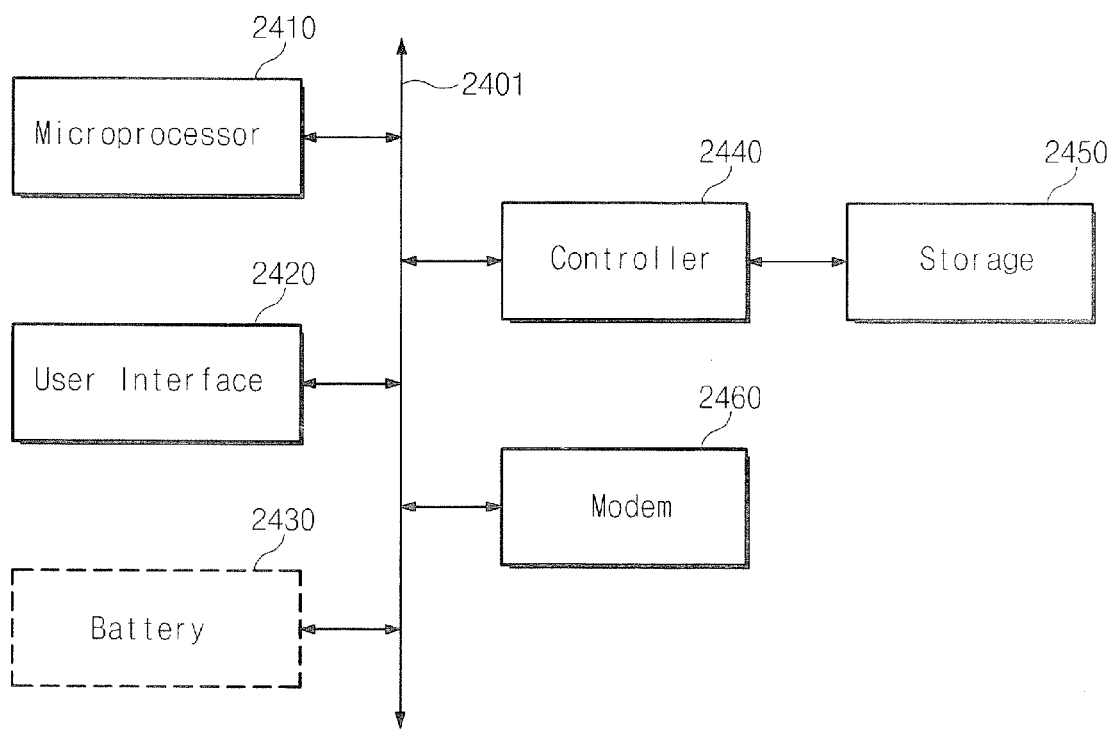
FIG. 11 is a block diagram showing a computing system including a storage media and a controller as illustrated in FIG. 9.

FIG. 11 is a block diagram showing a computing system including a storage media and a controller as illustrated in FIG. 9.

Referring to FIG. 11, a computing system includes a processing unit 2410 such as a microprocessor or a central processing unit, a user interface 2420, a controller 2440, the storage media 2450, and a modem 2460 such as a baseband chipset which are connected with a bus 3401. The controller 2440 and the storage media 2450 may be configured as like those shown FIG. 9 or 10 in substance. In the storage media 2450, N-bit data (where N is a positive integer) to be processed by the processing unit 2410 are stored through the controller 2440. If the computing system shown in FIG. 11 is a mobile apparatus, it may further include a battery 2430 for supplying power thereto. Although not shown in FIG. 11, the computing system may be further equipped with an application chipset, a camera image processor (e.g., CMOS image sensor; CIS), a mobile DRAM, etc. The controller 2440 and the storage media 2450 may form a solid state drive SSD or a memory card.

The storage media and/or the controller in FIGS. 9 to 11 may be packed by various types of packages such as PoP (Package on Package), Ball grid arrays (BGAs), Chip scale packages (CSPs), Plastic Leaded Chip Carrier (PLCC), Plastic Dual In-Line Package (PIMP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A data processing system comprising:
   a memory; and
   an encoder configured to encode data,
   wherein the encoder includes an outer encoder configured to generate an outer codeword by encoding the data, and an inner encoder configured to generate a plurality of inner codewords by encoding the outer codeword;
   wherein the encoder is configured to transfer the plurality of inner codewords to the memory; and
   wherein the outer codeword includes a message portion and a parity portion, and wherein the inner encoder is configured to generate the plurality of inner codewords by dividing each of the message portion and the parity portion of the outer codeword into a plurality of respective divided portions, respectively, each of the plurality of inner codewords including a corresponding divided message portion and a corresponding divided parity portion.

2. The data processing system of claim 1, further comprising:
   a decoder configured to receive the plurality of inner codewords from the memory and to decode the plurality of inner codewords, the decoder including an inner decoder configured to output the message portion and the parity portion of the outer codeword by decoding the plurality of inner codewords of the data received from the memory and an outer decoder configured to decode the message portion using the parity portion.

3. The data processing system of claim 1, wherein the outer encoder is configured to perform an encoding operation using a different coding technique from the inner encoder, and each of the outer and inner encoders is configured to perform an encoding operation using a block code or a tree code.

4. The data processing system of claim 1, wherein the memory comprises a storage media, and wherein the encoder is disposed within a controller configured to control the storage media.

5. The data processing system of claim 4, wherein the storage media and the controller comprise a solid state drive and/or a memory card.

6. The data processing system of claim 4, wherein the memory comprises a memory in a storage media, and the encoder is disposed within the storage media which operates responsive to a control of a controller.

7. A data processing system comprising:
   a memory; and
   an error control unit configured to encode the first data input to the error control unit and to decode second data received from the memory,
   wherein the error control unit is configured to generate a plurality of first inner codewords from a first outer codeword generated from the first data and to transfer the plurality of first inner codewords to the memory;
   and wherein the error control unit is further configured to generate an output message from a second outer codeword decoded from the second data, wherein the second data comprises a plurality of second inner codewords received from the memory;
   wherein the first outer codeword includes a first message portion and a first parity portion, and wherein the error control unit is configured to generate the pluralilty of first inner codewords by dividing each of the first message portion and the first parity portion of the outer codeword into a plurality of respective divided portions, respectively, each of the plurality of inner codewords including a corresponding divided first message portion and a corresponding divided first parity portion.

8. The data processing system of claim 7, wherein the error control unit comprises:
   a concatenated encoder including an outer encoder configured to generate the first outer codeword, and an inner encoder configured to generate the plurality of first inner codewords by encoding the first outer codeword; and
   a concatenated decoder including an inner decoder configured to output a second message portion and a second parity portion by decoding the plurality of second inner codewords received from the memory and an outer decoder configured to decode the second message portion based on the second parity portion.

9. The data processing system of claim 8, wherein the inner decoder is configured to detect and correct errors of second divided message portions in the plurality of second inner codewords based on parity data of the plurality of second inner codewords and reconstruct an estimated second outer codeword based on the second divided message portions and second divided parity portions in the decoded second inner codewords.

10. The data processing system of claim 9, wherein the inner decoder or the outer decoder is configured to reconstruct the estimated second outer codeword by collecting the second divided message portions in the decoded second inner codewords to construct a message of an estimated second outer codeword and collecting the second divided parity portions in the decoded second inner codewords to construct a parity of the estimated second outer codeword.

11. The data processing system of claim 9, wherein the outer decoder is configured to detect and correct errors of a message in the estimated second outer codeword based on the second parity data of the estimated second outer codeword and to send the message of the estimated second outer codeword to an external device as decoded information.

12. The data processing system of claim 7, wherein the outer encoder is configured to perform an encoding operation using a different coding technique from the inner encoder, and each of the outer and inner encoders performs an encoding operation using a block code and/or a tree code.

13. The data processing system of claim 12, wherein the inner decoder performs a decoding operation using a different coding technique from the outer decoder, and each of the outer and inner decoders performs an encoding operation using a block code and/or a tree code, wherein the outer encoder and the outer decoder use the same coding technique and the inner encoder and the inner decoder use the same coding technique.

14. A data processing system comprising:
a memory; and
an encoder configured to encode data,
wherein the encoder includes an outer encoder configured to generate a plurality of outer codewords by encoding the data, and an inner encoder configured to generate a plurality of inner codewords by encoding the plurality of outer codewords, the number of the plurality of outer codewords being less than the number of the plurality of inner codewords;
wherein the encoder is configured to transfer the plurality of inner codewords to the memory; and
wherein each of the plurality of outer codewords includes a message portion and a parity portion, and wherein the inner encoder is configured to generate the plurality of inner codewords by dividing the message portion and the parity portion of each of the plurality of outer codewords into a plurality of respective divided portions, respectively, each of the plurality of inner codewords including a corresponding divided message portion and a corresponding divided parity portion.

15. A data processing system comprising:
a memory; and
an encoder configured to encode data,
wherein the encoder includes an outer encoder configured to generate a plurality of outer codewords by encoding the data, and an inner encoder configured to generate a plurality of inner codewords for each of the plurality of outer codewords by encoding the plurality of outer codewords;
wherein the encoder is configured to transfer the plurality of inner codewords to the memory; and
wherein each of the plurality of outer codewords includes a message portion and a parity portion, and wherein the inner encoder is configured to generate the plurality of inner codewords by dividing the message portion and the parity portion of each of the plurality of outer codewords into a plurality of respective divided portions, respectively, each of the plurality of inner codewords including a corresponding divided message portion and a corresponding divided parity portion.

* * * * *